United States Patent [19]

Heeren

[11] 3,893,146

[45] July 1, 1975

[54] SEMICONDUCTOR CAPACITOR STRUCTURE AND MEMORY CELL, AND METHOD OF MAKING

[75] Inventor: Richard H. Heeren, Palatine, Ill.

[73] Assignee: Teletype Corporation, Skokie, Ill.

[22] Filed: Dec. 26, 1973

[21] Appl. No.: 427,874

[52] U.S. Cl. .............. 357/14; 340/173 CA; 357/23; 357/51; 357/53

[51] Int. Cl. .............................. H01l 11/00

[58] Field of Search ................. 357/14; 340/173 CA

[56] References Cited

UNITED STATES PATENTS

| | | | |
|---|---|---|---|
| 3,588,844 | 6/1971 | Christensen | 340/173 |
| 3,697,962 | 10/1972 | Beausoleil et al. | 357/14 |
| 3,740,731 | 6/1973 | Ohwada et al. | 357/14 |
| 3,740,732 | 6/1973 | Frandon | 357/14 |

*Primary Examiner*—Michael J. Lynch
*Assistant Examiner*—E. Wojciechowicz
*Attorney, Agent, or Firm*—J. L. Landis

[57] ABSTRACT

In one example, a random access memory cell includes an MOS gating transistor to activate the cell for reading, writing, or refreshing data stored on a cell capacitor structure. A typical cell transistor includes $P_1$ (input/output) and $P_2$ (cell storage) diffusions in an N-type substrate, $P_2$ serving as one terminal or plate of the cell capacitor structure. According to this application, a preferred cell capacitor is formed by diffusing an N+ region over a major portion of the $P_2$ region and extending beyond the $P_2$ region in electrical contact with the grounded N substrate. The primary cell capacitor is defined between the $P_2$ diffusion, a depletion region induced at the $P_2$-N+ junction when $P_2$ is charged, and the grounded N substrate. The N+ diffusion also reduces an unwanted parasitic capacitance between the $P_2$ region and a transistor gate conductor for the cell, reduces leakage currents and permits greater packing density of cells. More generally, the application relates to an improved semiconductor capacitor storage structure and method, including a substrate of one conductivity type, a first diffusion of the opposite type on the substrate and constituting one capacitor terminal, and a second diffusion of the substrate conductivity type covering most of the first diffusion and in electrical contact with the substrate, the second diffusion and substrate forming the second capacitor terminal. The dielectric of the capacitor storage structure is formed by a depletion region between the first diffusion and both the substrate and second diffusion.

7 Claims, 10 Drawing Figures

SEMICONDUCTOR CAPACITOR STRUCTURE AND MEMORY CELL, AND METHOD OF MAKING

INTRODUCTION AND BACKGROUND

This application relates generally to an improved semiconductor capacitor structure, and more particularly to an improved semiconductor memory cell and method of making, for use in a random access memory (RAM) of the type disclosed in my copending application, Ser. No. 361,377, filed May 17, 1973, herein incorporated by reference, now U.S. Pat. No. 3,938,404, granted Sept. 24, 1974.

As described in that application, each of thousands of memory cells includes a cell capacitor that can be accessed by a gating MOS transistor to either store a preset cell voltage (such as —5 volts) on the capacitor, or to ground the capacitor, depending on a data input signal selectively connected to the capacitor. As is common in such RAMS, the cell capacitors are arranged in an X–Y matrix, such that any particular cell can be selected to write data on the cell or to read out data previously written. Also, a system is provided to periodically refresh the charge stored on each cell capacitor, to make certain that a previously stored charge does not dissipate.

This application particularly concerns an improved cell capacitor structure especially useful in such a memory, with the objects of improving storage capacitance characteristics and hence memory cell signal performance, reducing cell size due to larger storage capacitance per unit area, reducing leakage current paths thus providing longer storage times and permitting closer packing of adjacent cell capacitor structures. A related aim is to reduce parasitic capacitance between one of the controlled electrodes (P-diffusions) and the gate conductors for the cell transistors.

SUMMARY

With the foregoing and other more specific objects in view, a cell capacitor in accordance with one example of this invention is formed in combination with a generally conventional MOS transistor; for example, a P-channel transistor having spaced P-diffusions serving as first and second controlled electrodes of the transistor, with a gate oxide region overlying portions of the P diffusions in conventional fashion. A gate electrode (such as an aluminum stripe) overlies the gate oxide to turn the transistor ON, when selected for access, so that a low-resistance path is established from one P-diffusion ($P_1$) to the other ($P_2$), and so that charge can flow from $P_1$, which serves as an I/O conductor, to $P_2$, which is formed as area diffusion or region and which constitutes one "plate" of the cell capacitor.

In accordance with this invention, in a specific example, a relatively large area N+ diffusion is formed on top of the $P_2$ diffusion and extends beyond the area of the P-diffusion, except in the area of the gate oxide, contacting the N-type substrate, the N+ diffusion and substrate area around the P-diffusion forming the second plate of the cell capacitor. The immediate area near the gate oxide of the P-diffusion forms the second controlled terminal of the transistor and is not covered by the N+ diffusion. This N+ diffusion reduces the parasitic capacitance between the gate electrode and $P_2$ by shielding action and minimizes leakage currents. The N+ diffusion extends beyond the edge of the P+ region and is in electrical contact with the normal N-type substrate, which is grounded as is conventional. The cell capacitor then is formed between the $P_2$ diffusion under the N+ diffusion, and both the N+ diffusion and the N substrate.

More generally, the invention relates to a capacitor structure, including a first region of T-type semiconductor material, meaning N or P. A region of $\overline{T}$ (P or N, respectively) semiconductor material is formed in a portion of the surface of the T region, and a second T region is formed covering a major portion of the surface of the $\overline{T}$ region and in electrical contact with the first T region. The $\overline{T}$ region can be connected to a source of charging potential, which then induces a depletion region at the $\overline{T}$-T junctions, which depletion regions serve as a capacitor dielectric, and the interconnected T regions serve as the second capacitor plate.

Other objects, advantages and features of the invention will be apparent from the following detailed description of specific embodiments and examples thereof, when read in conjunction with the accompanying drawings.

DRAWINGS

In the drawings, FIG. 1 is a circuit diagram of two adjacent memory cells of a RAM in accordance with my prior application, employing a cell capacitor array in accordance with both this application and the prior application.

DETAILED DESCRIPTION

Background and RAM Cell Operation

Figure 1:
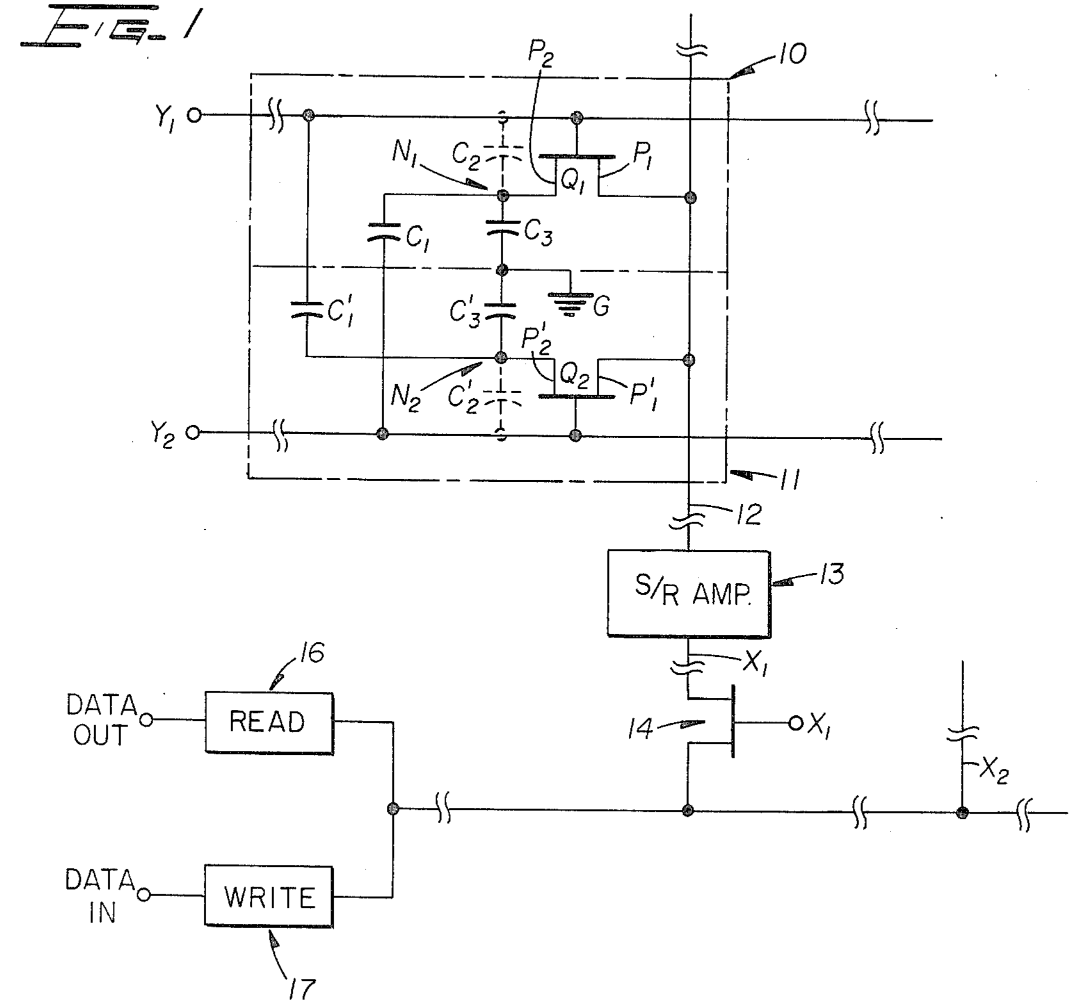
Figure 2:
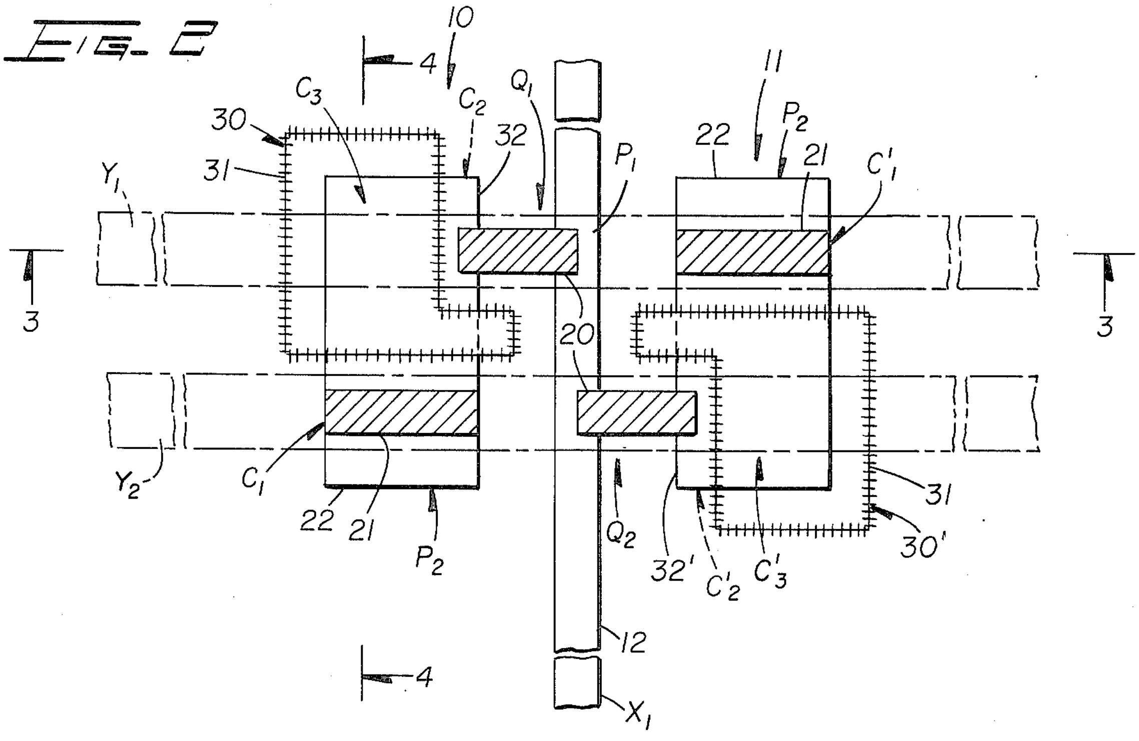
FIG. 2 is a layout drawing of two adjacent memory cells, looking from the top of the chip.

Referring now in detail to the drawings, FIG. 1 illustrates portions of a random-access memory circuit including a pair of adjacent memory cells 10 and 11, generally in accordance with the prior application, and FIG. 2 shows the layout of the two cells on an integrated circuit chip. Each cell includes an access transistor or gate $Q_1$, $Q_2$, which "selects" a particular cell for read, write, or refresh operations in the manner described in the prior application. In the specific example illustrated, the cell transistors comprise generally conventional P-channel, enhancement-mode field-effect transistors (sometimes referred to as MOSFETs or IGFETs) of the type described in Heeren-Winston U.S. Pat. No. 3,618,050 or Heeren U.S. Pat. Nos. 3,631,465 or 3,596,108.

The gate of $Q_1$ is coupled to a Y-access conductor such as $Y_1$, and the $Q_2$ gate is similarly coupled to an adjacent Y conductor such as $Y_2$. The Y-access conductors, or gate conductors, typically consist of aluminum or other conductive metalizations, formed on top of the IC chip and running across the width of the chip, meaning from left-to-right in FIGS. 1 and 2, so as to serve as an input conductor for a large number of cells arranged along the horizontal rows such as $Y_1$, $Y_2$ in FIGS. 1 and 2. The X, or vertical column, access to any cell such as 10 or 11 in a column of similar cells is provided through an I/O conductor, such as 12, which is connected to a corresponding one of a row of "sense/refresh" amplifiers, such as 13, in accordance with the prior application. The S/R amplifier 13 is connectable through an $X_1$ select transistor 14 to generally conventional read 16 or write 17 circuits, when it is desired to interrogate any of the cells such as 10 or 11 connected to the $X_1$ column, or to write information in a cell. The S/R amplifier 13 serves to refresh the charge (−V or 0 volts in the illustrative example) stored on a cell capacitor to be described, each time any cell in a Y row is selected, regardless of which X column is selected and whether or not a read or write operation is selected during that cycle.

When a Y-access conductor, such as $Y_1$, is energized, a −V voltage from a fixed power supply is applied to the $Y_1$ conductor, typically −6 to −8 volts and sufficient to turn ON the selected cell transistor $Q_1$ and all corresponding cell transistors in that row. This connects a first controlled terminal ($P_1$ diffusion) of the transistor $Q_1$ to the second controlled terminal ($P_2$ diffusion region), through the ON (low) resistance of the cell transistor $Q_1$. Thus, any logic signal (−V or ground) applied to the I/O conductor 12 from the S/R amplifier 13 is applied to the $P_2$ diffusion region. (On charging of a cell capacitor to −V, $P_1$ constitutes the drain of $Q_1$ and $P_2$ the source, in conventional terminology, but on discharging of a cell capacitor the reverse is true. Since the cell transistors $Q_1$, $Q_2$ are bidirectional transistors, the conventional source/drain terminology has little meaning.)

The diffusion region or island $P_2$ also defines a cell node $N_1$, which constitutes one plate or electrode of an array of cell capacitors $C_1$, $C_2$, $C_3$. $C_1$ is a cross-cell capacitor formed according to the principles of the prior-copending application. The other plate of $C_1$ is connected to a next adjacent Y access conductor, such as $Y_2$, which is invariably at ground whenever the $Y_1$ conductor is "hot," thus providing a cross-cell storage capacitance $C_1$ to the ground of $Y_2$, when $Y_1$ is selected. The $C_1$ cross-cell capacitor may or may not be used (is not necessary) in conjunction with the improved cell capacitance structure of this invention for a RAM storage cell.

$C_2$ is an unwanted, parasitic capacitance between $P_2$ and the $Y_1$ address bus (aluminum gate metalization). One main object of this invention is to reduce the value and minimize the effect of $C_2$, as will be explained hereafter.

Figure 3:
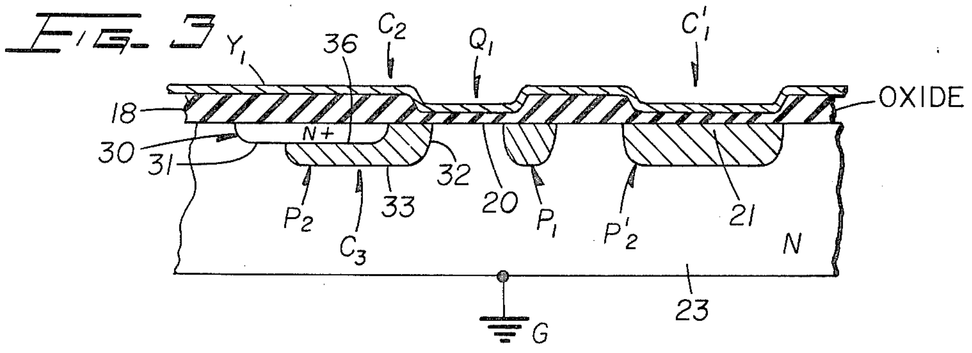
FIG. 3 is a section through the cells, along line 3—3 of FIG. 2, with vertical dimensions exaggerated to illustrate details.
Figure 4:
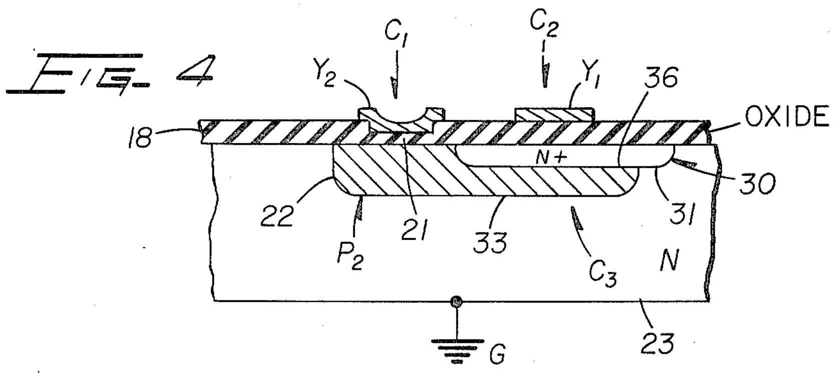
FIG. 4 is a corresponding section along line 4—4 of FIG. 2.

$C_3$ is a built-in semiconductor capacitor according to this invention, which will be described in detail hereafter. $C_3$ may be used either in combination with the $C_1$ capacitor of the prior application, or alone, in which case the $C_1$ capacitor is omitted entirely. The second terminal or plate of $C_3$ is connected to a fixed circuit ground G comprising the N substrate of the chip, which is conventionally grounded as indicated in FIGS. 3 and 4.

The next adjacent cell 11 is similarly formed, except that the corresponding cross-cell capacitor $C'_1$ is connected to the $Y_1$ conductor to provide ground whenever the $Y_2$ conductor is energized. The cell capacitor $C'_3$ is connected between a corresponding $P'_2$ diffusion (constituting cell node $N_2$) and the common substrate ground G. A parasitic capacitance $C'_2$ similarly exists between the $P'_2$ diffusion and the $Y_2$ bus.

Further details of the operation of the memory cells 10, 11 and the RAM circuit in accordance with a preferred embodiment of the system are described in the prior application. For the purposes of this application, concerning the structure of the cell capacitances $C_2$ and $C_3$, the significant operation is that the combined memory cell capacitance $C_3$, $C_2$ (and $C_1$ where used) is either charged from the I/O conductor 12 through the ON cell transitor such as $Q_1$, to a voltage such as −5 volts, to represent a binary data bit of one type (0 or 1), ), or is discharged to ground through $Q_1$ and conductor 12 when the opposite state is to be stored. This is a typical example of the type of negative logic used in RAM cells of this general kind, although many other arrangements are possible depending on the type of gating system or transistors used and the system parameters.

CELL STRUCTURE

Referring now to FIGS. 2–4, the layout of two typical adjacent cells 10 and 11 on an I.C. chip, such as a silicon chip in the example, is depicted in accordance with a first embodiment of the invention. Looking from the top down into the silicon, the Y-address busses such as $Y_1$ and $Y_2$ (phantom lines in FIG. 2) typically constitute long aluminum metalizations or other types of conductors running the width of the chip and capable of turning ON all of a large number of cell transistors in any selected row, such as $Q_1$ when the $Y_1$ row is selected. The busses $Y_1$, $Y_2$, etc. are insulated from the underlying silicon areas at most points by a "thick oxide" or other insulating layer 18 (FIGS. 3 and 4, assumed but not shown in FIG. 2), typically $SiO_2$ in conventional silicon integrated circuits.

At the transistor $Q_1$, $Q_2$ gate regions, a thin oxide layer 20 (typically $SiO_2$ or a combination of oxides or other gate insulating material) is formed (hatched areas in FIG. 2) as is generally conventional in MOS circuit manufacture. Beneath the gate oxide regions 20 are formed the P diffusions such as $P_1$, $P_2$, as is generally conventional, constituting the controlled terminals of the cell transistors. Typically, the $P_1$ diffusions are long diffusions running the length of the storage array on the chip and comprising the I/O column conductors, such as 12, or the X-access conductors such as $X_1$ for a vertical column of parallel cells as depicted in FIGS. 1 and 2. The $P_2$ diffusions comprise isolated islands or storage-node diffusions (outlined in solid lines in FIG. 2), as will be described in further detail hereafter. The $C_1$ capacitors, where used, consist of a second thin oxide region 21 as the dielectric, an outwardly extending area 22 of the $P_2$ diffusion as one plate, and the overlying area on the next adjacent bus as the other plate; for example $P_2$, thin oxide 21, and $Y_2$ bus for the cell 10 capacitor $C_1$. Further details of the $C_1$ cell capacitor and its operation are described in the prior application previously cited.

The unwanted parasitic $C_2$ capacitances comprise the overlapping areas of the $P_2$ diffusions and the associated Y bus, such as $P_2$ and $Y_1$ for cell 10, with the thick oxide region 18 therebetween as dielectric. This parasitic capacitance is unwanted because, when the cell 10, for example, is selected, the addressing signal on the $Y_1$ conductor is partially coupled onto the storage node $N_1$ and may partially damage the signal level stored on the storage node, thus it may oppose the desired action of the cell storage capacitors $C_3$ and $C_1$ (where used).

As is conventional in P-channel, enhancement mode devices, the P-diffusions or regions $P_1$ and $P_2$, are formed according to a prescribed mask pattern in one surface of a substrate 23 of an N-type semiconductor, such as N-type silicon, portions of which also constitute the transistor $Q_1$, $Q_2$ gate regions under the thin oxide layer 20 in the space between the $P_1$ and $P_2$ diffusions. As previously mentioned, the substrate 23 is conventionally grounded, meaning connected to circuit ground designated G, through the mounting frame or package for the completed I.C. chip.

CELL CAPACITANCES $C_3$ AND $C_2$

To form the $C_3$ cell capacitors and to minimize the value of the parasitic $C_2$ capacitance, in accordance with this invention, an N+ region or island 30 is diffused into areas of the upper surface (FIGS. 3 and 4) of each $P_2$ region, and extends beyond the $P_2$ region in some areas to make contact with the underlying N substrate 23 at various points, such as 31 in FIGS. 2–4. In FIG. 2, a desirable contour for the N+ region 30 – in accordance with the first embodiment of the invention is indicated with the crossed "railroad track" lines. As shown in FIG. 2, the N+ area 30 preferably overlaps and extends beyond as much as possible of the outer boundary of the $P_2$ region, except for a small rectangular area 32 which is needed to serve as the second controlled terminal of the cell transistor, such as $Q_1$, and which serves as an input/output terminal for the region $P_2$, to charge or discharge the cell capacitors $C_1$, $C_2$, $C_3$, when a cell is selected. Also, where the cross-cell capacitors such as $C_1$ are used, the N+ region does not cover the extended region 22 of the $P_2$ diffusion, which must serve as one plate of the capacitor $C_1$ as previously described. Where the $C_1$ capacitor is not used, the N+ diffusion 30 preferably extends beyond the outer margin of the $P_2$ diffusion (lower edge in FIG. 2, left) by approximately the same distance as shown in FIG. 2 for the left and top margins of $P_2$. A preferred example of such a construction is described hereafter in connection with FIGS. 8 and 9. Thus, the N+ diffusion 30 should overlap the $P_2$ diffusion substantially at all points except the immediate area of the gate oxide 20, so as to provide electrical contact 31 between the N+ diffusion and the N substrate 23 all around the $P_2$ diffusion or islands, except at the second controlled terminal of the cell transistor such as $Q_1$.

One function of the N+ region 30 is that it isolates and shields the $P_2$ diffusion from the Y bus, such as $Y_1$ for cell 10, thus significantly reducing th value of the parasitic capacitance $C_2$ between the $P_2$ island or plate and the $Y_1$ address conductor, as will be explained in further detail hereafter.

Figure 5:
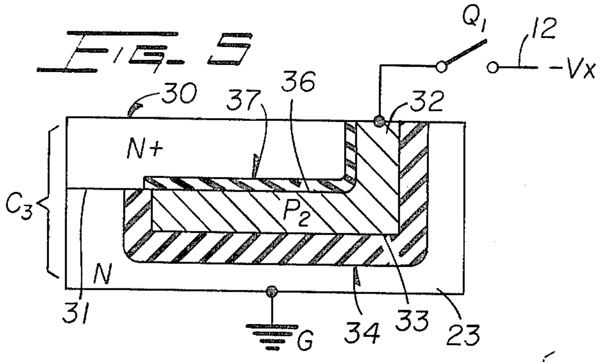
FIG. 5 is a schematic section of a cell capacitor of this invention, illustrating the operation on charging.

The combination of the overlapping areas of the $P_2$ diffusion and the N+ diffusion also serves, in combination with the grounded N-type substraate 23, to form an improved cell capacitor $C_3$ in accordance with this invention, one with a far greater capacitance per unit area than would result from the $P_2$-grounded N substrate combination alone. To explain this in more detail, FIG. 5 illustrates schematically the physical principles involved.

When data is to be stored on the cell capacitor $C_3$, the second-controlled electrode region or projection 32 of $P_2$ is connected through $Q_1$ and the I/O conductor 12 to either a charging voltage $-V_X$ of, for example, −5 volts, or to subtantially 0 volts (circuit ground) based on the operation of the S/R amplifier 16, or the write circuit 17 as explained in detail in the prior application. Considering now the case where the $P_2$ region or island switches from substantially O volts to a cell charge of nearly −5 volts from $-V_X$, at this time the $P_2$ island begins to charge negatively and electrons flow from the power source $-V_X$ into the $P_2$ region. This repels electrons from the $P_2$-N substrate junction, 33, and forms a depletion region 34 at the junction. The depletion region 34 resides primarily in a thin layer of the substrate 23 adjacent the junction 33, but also is formed in a much thinner adjacent layer of the $P_2$ region, as is known in the art. Thus, at this time, the $P_2$-N junction 33 comprises a back-biased diode, through which electrons cannot significantly pass to the bulk of the grounded substrate 23. The depletion region 34, in effect, forms a capacitor dielectric, in the parallel plate capacitor analogy, between the $P_2$ capacitor plate and the N-ground plate (substrate 23). This $P_2$-N capacitance is a standard intrinsic capacitance, inherent in the standard P-channel transistor design; but it has a very low value, as will be explained further hereafter, based on the relatively low level of doping represented by N as distinguished from N+.

Considering the N+ region or island 30, it also forms a P-N junction 36, $P_2$-N+, at the boundary between $P_2$ and N+, which junction is made as large in area as feasible, as explained previously. At this $P_2$-N+ junction, electrons are also repelled, as the diffused area $P_2$ charges toward $-V_X$, to form a second depletion region 37. However, in this case, the N+ region can be doped far more heavily than the N substrate, for example several orders of magnitude more heavily in a typical example, using a doping impurity from Group V, such as phosphorus, arsenic, etc.

Thus, far more dopant atoms are present in the vicinity of the junction 36, having excess mobile planetary electrons to be repelled. For this reason, the $P_2$-N+ depletion region 37 is far thinner than the $P_2$-N substrate region 34, and the $P_2N+$ capacitor therefore has a far higher capacitance per unit area, typically 10 times greater, than the $P_2$-N substrate capacitor. And, of course, the $P_2$-N+ capacitance is achieved in the same area as already needed for the $P_2$ diffusion, since it overlies the $P_2$ diffusion, and is in effect "for free" so far as using extra silicon area or "real estate" is concerned.

Figure 6:
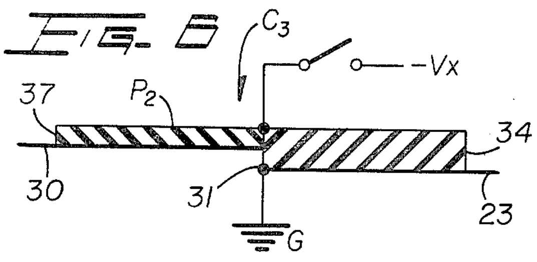
FIG. 6 is a schematic electrical equivalent diagram corresponding to FIG. 5.

In effect, the $P_2$-N+ capacitance comprises a relatively large capacitor connected in parallel with the $P_2$-N substrate capacitor. This is further evident in FIG. 6, which is an electrical schematic of the combined, equivalent parallel plate capacitor thus formed. Since the N+ body is connected to the N substrate body through the contact regions 31 all around the $P_2$ island, the N+ and N "plates" are both effectively connected to circuit ground G for the purposes of the FIG. 6 analogy.

When the plate $P_2$ of capacitor $C_3$ is connected to circuit ground through the transistor $Q_1$ and the S/R amplifier 13, or the write circuit 17, as described in the prior application, the $P_2$ region is able to discharge the stored electrons rapidly to ground, and the induced depletion regions 34 and 37 then substantially disappear.

In circuit design, for practical purposes, by adjusting the area of the $P_2$ region, as viewed in the layout of FIG. 2, one sets the effective capacitor "plate" area, and by adjusting the number of impurity atoms in the N+ diffusion, one sets the value of the dielectric for a given charge desired to be stored. Preferably, the $P_2$ diffusion comprises a P+ diffusion, thus enhancing the capacitance per unit area of both the $P_2$-N+ and $P_2$-N junctions, and forming what is known in the art as a "stepped junction." A typical memory cell use of the storage capacitance structure of this invention has a $P_2$ plate area of approximately 1 square mil, an N+ density of approximately $10^{21}$ dopant atoms per cubic centimeter, a P+ density of approximately $10^{19}$ atoms per cc, an N substrate density of approximately $10^{15}$atoms per cc, and a storage capacitance of approximately 0.9 pfd at 0 volts.

Figure 7:
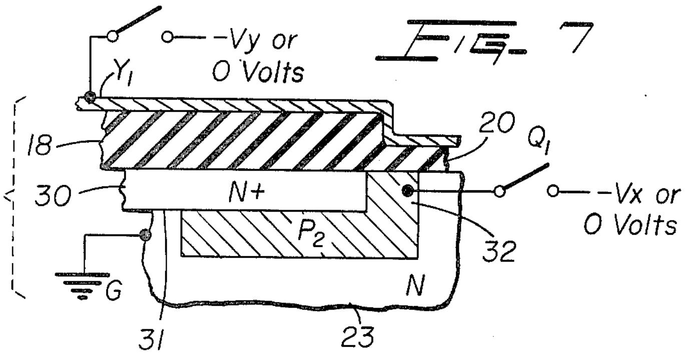
FIG. 7 is a schematic section of a portion of the cell as in FIG. 3, illustrating the operation of the invention in minimizing the value of a parasitic diffusion-to-gate conductor capacitance.

To explain in more detail the principles involved in reducing the value and effect of the parasitic $C_2$ capacitance between the Y address bus, such as $Y_1$, and the $P_2$ region, FIG. 7 depicts the physical principles involved, similarly to FIG. 5 for the $C_3$ capacitor. The N+ region 30 is conductive and electrically connected to the substrate 23 and ground G through the N+-substrate junction regions such as 31. Hence, the N+ region forms a ground shield for the $P_2$ region, shielding the $P_2$ region from the $Y_1$ conductor or bus everywhere except in the portion 32 of the $P_2$ region in the vicinity of the gate thin oxide 20. A substantial portion of the $C_2$ capacitance electrode area, of diffusion $P_2$, is replaced by the N+ ground electrode 30. From the storage-capacitance node point of view, $C_2$ has been greatly reduced and, from the $Y_1$ conductor or bus point of view, the capacitance $C_2$ has been changed from a capacitance to the $P_2$ region, to a capacitance almost entirely to ground. The effect of reducing the capacitance $C_2$ from the storage node $P_2$ is to reduce the amount of the selection signal appearing on the $Y_1$ bus being capacitively coupled onto the storage node $P_2$. This coupled selection signal on storage node $P_2$ can be in opposition to data voltages on the storage node, and thus would partially reduce their levels or destroy them. Hence, this coupling should be minimized. In a typical memory cell according to the principles of this invention, $C_2$ typically can be reduced from approximately 0.02 pfd. to approximately 0.01 pfd., and the amount of the selection signal coupled to storage node $P_2$ thereby cut in half.

SECOND EMBODIMENT

Figure 8:
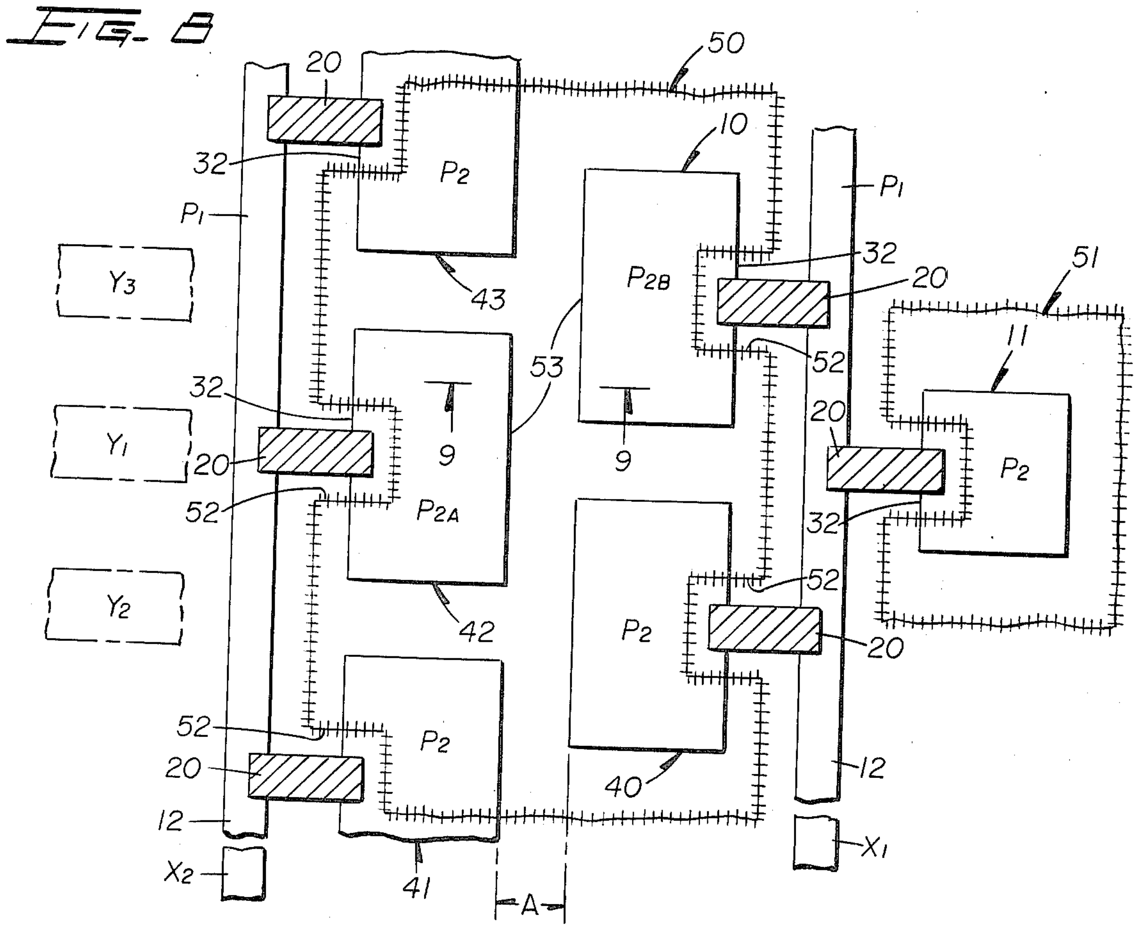
FIG. 8 is a layout drawing of an alternative embodiment of the invention, similar to a portion of FIG. 2 but also showing additional cells.

Referring to FIG. 8, a second embodiment of the invention is illustrated, wherein the $C_1$ capacitors of FIG. 2 are eliminated. The layout in FIG. 8 is the same as in FIG. 2, except that four additional adjoining cells 40–43 are illustrated, which correspond in function to the cells 10 and 11 previously described, to store additional bits of information from the $Y_1$, $Y_2$ and $X_1$ inputs previously described, and from additional adjacent inputs $X_2$ and $Y_3$ corresponding to the other inputs and as described in the prior application. In this embodiment, the N+ diffusions, shown as individual islands 30 in FIG. 2, are formed as large area plates or "slabs" 50–51, running the entire length of the cell area of the chip (top to bottom in FIG. 8) between adjacent $P_1$ diffusions such as $X_1$ and $X_2$. As in FIG. 2, the boundaries of the N+ diffusions are designated by the crossed lines. The N+ diffusions, such as 50, cover substantially all of a great many adjacent $P_2$ diffusion islands such as for cells 41, 42, and 43 in one column connected to the $X_2$ input $P_1$ diffusion, and the adjacent column of $P_2$ islands for cells 40 and 10 connected to the $X_1$ input $P_1$ diffusion. Similarly, the next adjacent N+ diffusion 51 covers cells such as 11 in a left column and an adjacent column of cells (not shown) to the right of the column containing cell 11. The N+ diffusions 50 are, of course, spaced from the $P_1$ address diffusions, and are regularly cut out as indicated by the numeral 52 to uncover the cell transistor controlled electrode regions 32 as previously described.

With this arrangement of a continuous N+ cover for a large number of adjoining $P_2$ diffusion islands, the N+ cover being located between each pair of $P_1$ diffusions, the advantages of the N+ diffusions are maximized, while the manufacturing and mask-making techniques are simplified since a small number of long N+ diffusions or slabs such as 50 are built, rather than a much greater number of individual islands, such as 30 in FIG. 2.

REDUCTION IN LEAKAGE CURRENTS

Figure 9:
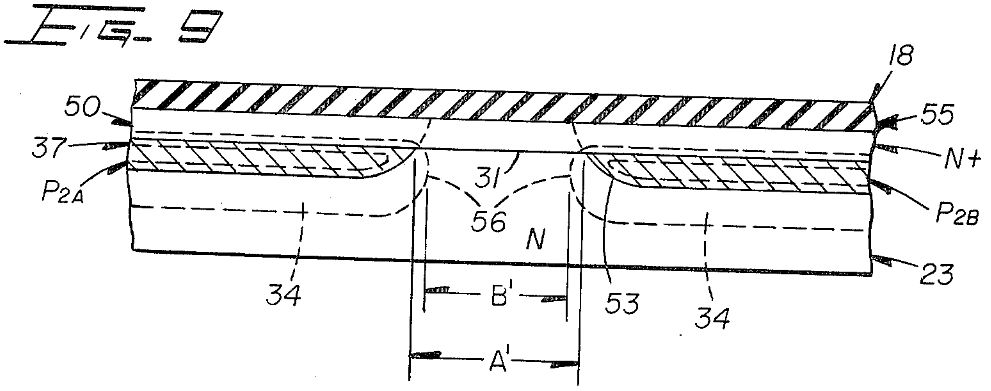
FIG. 9 is a fragmentary section through a portion of the chip, showing the relation between two adjacent storage-node diffusions; for example, as taken along line 9—9 of FIG. 8.
Figure 10:
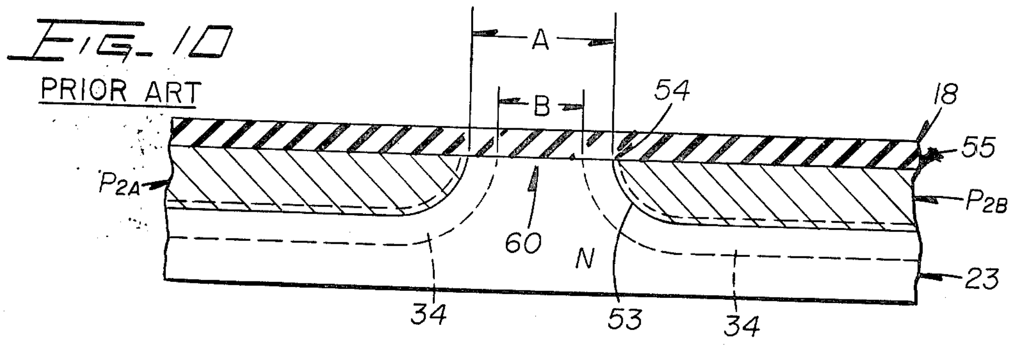
FIG. 10 PRIOR ART
FIG. 10 is a view similar to FIG. 9, but showing a typical structure in accordance with the prior art.

A further improvement in storage capacitance characteristics afforded by the N+ diffusion structure of this invention (either the FIG. 2 or the FIG. 8 construction) is a reduction in leakage current, which tends to destroy the data being stored. Ideally, data on a storage capacitance would remain indefinitely, never "leak" off and never require refreshing. However, all practical capacitances which can be built have parasitic and undesired leakage paths and are imperfect. There are several leakage mechanisms in semi-conductor junction capacitances: thermally generated leakage current, leakage current due to atomic imperfections in semiconductor crystals, contamination caused by leakage currents, and leakage currents caused by surface imperfections. All of these leakage currents, except the thermally generated one, in a practical semiconductor region, such as the P-diffusion island $P_2$, are highly concentrated near the oxide-semiconductor interface and the perimeter of the diffusion region; that is, the portions of the perimeter of the $P_2$ regions such as 53 in FIG. 8, away from the transistor gate regions 20, from which the charge is applied. Referring now to FIGS. 9 and 10, FIG. 9 shows a typical $P_2$ to $P_2$ spacing cross section in accordance with this invention, and FIG. 10 shows a corresponding spacing in accordance with the prior art, where the N+ shielding diffusion 30 or 50 is not used. These sections can be as viewed along line 9—9 of FIG. 8, or any other $P_2$ to $P_2$ region in FIGS. 8 or 2.

Referring first to FIG. 10, the leakage current, as previously described, tends to be highly concentrated at the junction of the $P_2$ perimeter 53 and the thick oxide layer 18 overlaying the $P_2$ regions in conventional practice. This high-leakage region is designated by the numeral 54 in FIG. 10, being the point of contact between the $P_2$ perimeter and the semiconductor-oxide interface, designated 55.

As explained previously, in accordance with this invention, as much as possible of the area and perimeter 53 of the $P_2$ diffused regions is covered by the N+ diffused region 50 (or 30 FIG. 2), thus in effect "burying" as much as possible of the $P_2$ perimeter 53 away from the oxide-semiconductor interface 55 as shown in FIG. 9. In this case, the interface 55 is primarily with the shielding N+ diffusion, not with the $P_2$ region. The results are a much lower overall leakage current for the junction capacitor $C_3$. In a typical memory cell application according to the principles of this invention, the leakage current of the cell is reduced by approximately 10 times, and thus the memory cells in the memory array need be refreshed only a tenth as often.

$P_2$—$P_2$ SPACING CHARACTERISTICS

A further advantage of the storage capacitance structure of this invention is that closer spacing of adjacent cells is made possible by the N+ diffusion. In FIGS. 9 and 10, $P_{2A}$ and $P_{2B}$ represent any two adjacent storage node $P_2$ diffusions, as previously described. In the conventional cells of FIG. 10, these storage node diffusions $P_{2A}$ and $P_{2B}$ are isolated from each other as long as the two junction depletion regions 34 (shown in dashed lines) do not touch each other and there is a non-depleted N-type substrate region 60 between them of a width B. The distance the depletion regions spread out from the P-N junction toward each other is a function of voltage on the P-diffusions and the doping densities of the P-diffusions and N-type substrate. Thus, for a given operating voltage range on the storage node P-diffusions, say −5 volts, there is a minimum distance (A in FIG. 10) by which the P-diffusions must be separated in order to maintain electrical isolation between them.

In FIG. 9, where the N+ diffusion layer such as 50 (or 30 FIG. 2) has been added, and it can be seen that the effective P—P spacing has been increased from A in FIG. 10, to A′ in FIG. 9, since the N+ region eliminates part of the sidewalls 53 of the P-diffusion perimeters In addition, the "isolation distance" between depletion regions regions has an even larger difference between B and B′ than between A and A′, as the doping density of the N+ region "narrows down" or bends the $P_2$ to N substrate depletion region 34 at the P-diffusion N+ intersection perimeter, as indicated by the inwardly curving sections designated 56. Hence, for a given storage node operating voltage, the $P_2$ regions in FIG. 9 can be spaced closer together than those in FIG. 10, while still maintaining isolation. This means the improved capacitance storage structure of this invention allows higher circuit densities for a given area, or that the same storage characteristics can be achieved with a smaller $P_2$ cell area. Since, as is apparent in FIG. 8, the largest portion of the cell area is used by the $P_2$ islands, it follows that permitting smaller $P_2$—$P_2$ spacings (distance A′) allows more memory cells 10, 11, etc. to be integrated in a given chip area. Further, the combination of reducing $P_2$—$P_2$ spacing just described, with allowing more charge to be stored on a given $P_2$ area, as previously described, significantly reduces cell area required for a given charge.

SUMMARY AND EQUIVALENTS

In view of the foregoing description, it should be apparent that there has been provided an improved semiconductor capacitance to ground, with significantly larger capacitance, smaller leakage currents, and larger packing densities than could be achieved by the diffusion to substrate couple commonly provided in MOS chips, and that such a capacitor is useful as a memory storage device in semiconductor memory cells such as the RAM cell of my prior application Ser. No. 361,377, or in many other such cells and memories and capacitor storage applications known in the art. Since the capacitor $C_3$ structure is formed or built into the semiconductor chip as part of the I.C., it requires no additional real estate beyond that required for the $P_2$ islands or nodes, and no additional circuit connections since the $P_2$ and N+ diffusions are isolated, and the substrate 23 is conventionally grounded. Further, the N+ diffusions can readily be formed by conventional I.C. manufacturing techniques, and all that is required to build the improved capacitor cell is one additional mask (defining the N+ regions) and one extra diffusion step.

While the invention has been particularly described in terms of the conventional P-channel MOS technology, where it probably finds its greatest utility, it could also be applied to many other types of semiconductor or integrated circuit cells. In the MOS or similar environment, the N+ diffusion further serves the additional function of reducing the parasitic $C_2$ capacitance in a memory cell application, and thus further improving cell operation.

From the nature of the enhanced $C_3$ capacitance due to the N+ diffusion, it should be further apparent that larger capacitances can be built with $P_2$ diffusion areas of a given size, or that smaller $P_2$ areas can be used to achieve a given capacitance. This, of course, saves silicon "real estate" and allows more memory cells, such as 10–11, to be formed in a given chip area for a given cell capacitance required. Further, the $P_2$ -to-$P_2$ diffusion spacings can be reduced in accordance with the invention, as above described, thus allowing larger packing densities of capacitance storage structures.

Since there are many combinations that can be used, with P and N diffusion reversed for other types of semiconductors, the letter T (or the designation "type I" semiconductor material) is used to designate the conductivity type of the substrate (P or N, N in the example given); $\overline{T}$ (or the "type II") the capacitor plate diffusion of the opposite conductivity type, corresponding to $P_2$ in the example; and T, (or "type I"), or preferably T+ (or I+), the additional diffusion corresponding to N+ in the example. Thus, the improved capacitor structure consists of a T-$\overline{T}$-T sandwich, where $\overline{T}$ is connectable to a source of charging or discharging potential, and the T regions are connected to each other and to circuit ground or some low voltage bias potential desired for the other plate of the capacitor. While the T+ structure is preferred, it is not necessary to the invention and the structure can be a T-$\overline{T}$-T sandwich, with some sacrifice in capacitance value. The expression "ground" or "grounded" in connection with the substrate 23, or T region, will be understood to refer to circuit ground, or any other low voltage bias as is well known in the art. The designations N+, P+ (and thus T+ or I′) are well understood in the art, and refer to doping concentrations of levels greatly in excess of the normal substrate level, such as N in the example.

It should further by apparent that many other variations may be made from the specific details described in connection with the illustrative embodiment of the invention, without departing from the spirit and scope of the invention.

What is claimed is:

1. An improved cell capacitor structure for an MOS integrated circuit memory chip of the type having a cell-gating field-effect transistor including a grounded substrate of type I semiconductor material and first and second controlled terminals consisting of first and second diffusions of type II semiconductor material formed in the upper surface of the substrate, the first controlled terminal being selectively connectable (1) to a source of charging potential for the cell to store charge on the second controlled terminal when the transistor is turned ON, or (2) to ground to discharge any stored charge on the second controlled terminal when the transistor is turned ON, the second diffusion being an isolated island of substantial area unconnected to external circuits so as to form a first electrode of the cell capacitor, the grounded substrate forming the second electrode of the cell capacitor, and the induced depletion region formed at the second diffusion to substrate junction when the second diffusion is charged constituting the capacitor dielectric, the improved cell capacitor structure being characterized in that:

a third diffusion, of type I+ semiconductor material, is formed in the upper surface of the chip overlying the second diffusion area except for the second controlled terminal area of the transistor, the third diffusion being covered by an insulating layer of oxide and being isolated from external circuits, the third diffusion extending beyond the periphery of the second diffusion into electrical contact with the grounded substrate, the interconnected substrate and third diffusion together forming the second electrode on the cell capacitor and the induced depletion region formed at the junction between the second and third diffusions when the second diffusion is charged constituting the major portion of the cell capacitance.

2. A cell capacitor structure as recited in claim 1, wherein the substrate comprises an N-type silicon substrate, the first and second diffusions are P diffusions, the third diffusion is an N+ diffusion, and the insulating layer comprises a thick layer of $S_iO_2$.

3. A cell capacitor structure as recited in claim 1, wherein a gate conductor for the MOS field-effect transistor overlies a portion of the second diffusion, being separated therefrom by the third diffusion and by the insulating layer formed on the third diffusion, the third diffusion serving to reduce the intrinsic parasitic capacitance between the gate conductor and the second diffusion.

4. An MOS cell capacitor structure as recited in claim 1, wherein the cell capacitance consists entirely of the P-N junction capacitance recited in claim 1, the third diffusion overlapping the entire perimeter of the second diffusion area except for the second controlled terminal area of the transistor.

5. An improved random access memory comprising an array of MOS memory cells as recited in claim 4, arranged in an X–Y matrix of columns (X) and rows (Y) as viewed from the top of the chip and further characterized in that:

there are a plurality of parallel first diffusions ($P_1$), each consisting of an elongated diffusion of P-type silicon formed in the upper surface of a common substrate of N-type silicon, each $P_1$ diffusion serving as an I/O column conductor (X) for a plurality of individual cells arranged in parallel columns on both sides of each $P_1$ diffusion, to charge, discharge and refresh the associated cell capacitances at periodic intervals;

there are a plurality of second diffusions ($P_2$), each consisting of an isolated rectangular island of P+ type silicon formed in the upper surface of the substrate, the $P_2$ islands being arranged in parallel rows spaced from each other and spaced from a corresponding $P_1$ diffusion so as to define a cell gating transistor between one edge of each $P_2$ island and the corresponding $P_1$ diffusion; and the third diffusion (50) comprises an elongated slab of N+ type silicon extending in the area between each pair of $P_1$ diffusions and spaced therefrom, each N+ diffusion covering all $P_2$ islands in the space between the $P_1$ diffusions except for a rectangular cut out region (52) defining the second controlled terminal region of each cell transistor, the third diffusion burying all of each $P_2$ island beneath the surface oxide layer except for the controlled terminal area of each cell transistor, so as to minimize leakage current from the $P_2$ regions and so as to permit closer spacing between $P_2$ islands.

6. An improved random access memory as recited in claim 5, further characterized in that:

a plurality of row conductors (Y), consisting of parallel aluminum strips are deposited on the oxide layer and run across the chip in the Y direction, each Y conductor serving as a gating input to a plurality of transistors in a row and being separated from the silicon by thick oxide except for the gate region of each transistor where it is separated by thin oxide, the third diffusion serving to reduce the intrinsic parasitic capacitance ($C_2$) between each gate conductor and the underlying $P_2$ diffusions.

7. In a process of fabricating an MOS integrated circuit memory chip, of the type wherein first and second diffusions of type II semiconductor material are formed in portions of the upper surface of a substrate of type I semiconductor material to define first and second controlled terminals of a field-effect transistor, a thin gate oxide region is formed in the upper surface of the substrate between the first and second controlled terminal regions, thick oxide insulating regions are ultimately formed over the other areas of the upper surface of the chips, and a gate conductor is deposited over the thin oxide gate region and extending across the chip over portions of the thick oxide and overlying portions of the second diffusion area, the second diffusion being an isolated island of substantial area unconnected to external circuits so as to define a cell capacitance to the grounded substrate when charged from the first diffusion through the transistor when the transistor is turned ON, a method of reducing parasitic capacitance between the access conductor and the second diffusion, which comprises:

prior to formation of the oxide layers, forming a third diffusion, of type I+ semiconductor material, in the upper surface of the chip overlying the second diffusion area except for the second controlled terminal area of the transistor, the third diffusion extending beyond the periphery of the second diffusion into electrical contact with the grounded substrate, the third diffusion forming a ground shield for the second diffusion to reduce the parasitic capacitance between the access conductor and the second diffusion.

* * * * *